(12) United States Patent
Leschkies et al.

(10) Patent No.: US 11,676,832 B2
(45) Date of Patent: Jun. 13, 2023

(54) LASER ABLATION SYSTEM FOR PACKAGE FABRICATION

(71) Applicant: Applied Materials, Inc., Santa Clara, CA (US)

(72) Inventors: Kurtis Leschkies, San Jose, CA (US); Jeffrey L. Franklin, Albuquerque, NM (US); Wei-Sheng Lei, Santa Clara, CA (US); Steven Verhaverbeke, San Francisco, CA (US); Jean Delmas, Santa Clara, CA (US); Han-Wen Chen, Cupertino, CA (US); Giback Park, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 159 days.

(21) Appl. No.: 16/938,517

(22) Filed: Jul. 24, 2020

(65) Prior Publication Data

US 2022/0028709 A1 Jan. 27, 2022

(51) Int. Cl.
*H01L 21/67* (2006.01)
*H01L 21/48* (2006.01)
(Continued)

(52) U.S. Cl.
CPC .... *H01L 21/67121* (2013.01); *B23K 26/0622* (2015.10); *B23K 26/382* (2015.10);
(Continued)

(58) Field of Classification Search
CPC ............ B23K 2101/40; B23K 26/0622; B23K 26/0648; B23K 26/082; B23K 26/382;
(Continued)

(56) References Cited

U.S. PATENT DOCUMENTS

| 4,073,610 A | 2/1978 | Cox |
| 5,126,016 A | 6/1992 | Glenning et al. |

(Continued)

FOREIGN PATENT DOCUMENTS

| CA | 2481616 C | 1/2013 |
| CN | 1971894 A | 5/2007 |

(Continued)

OTHER PUBLICATIONS

PCT International Search Report and Written Opinion dated Feb. 4, 2022, for International Application No. PCT/US2021/053830.

(Continued)

*Primary Examiner* — Dana Ross
*Assistant Examiner* — Joseph W Iskra
(74) *Attorney, Agent, or Firm* — Patterson + Sheridan, LLP (57) ABSTRACT

The present disclosure relates to systems and methods for fabricating semiconductor packages, and more particularly, for forming features in semiconductor packages by laser ablation. In one embodiment, the laser systems and methods described herein can be utilized to pattern a substrate to be utilized as a package frame for a semiconductor package having one or more interconnections formed therethrough and/or one or more semiconductor dies disposed therein. The laser systems described herein can produce tunable laser beams for forming features in a substrate or other package structure. Specifically, frequency, pulse width, pulse shape, and pulse energy of laser beams are tunable based on desired sizes of patterned features and on the material in which the patterned features are formed. The adjustability of the laser beams enables rapid and accurate formation of features in semiconductor substrates and packages with controlled depth and topography.

18 Claims, 7 Drawing Sheets

(51) Int. Cl.
*B23K 26/0622* (2014.01)
*B23K 26/382* (2014.01)
*H01L 23/498* (2006.01)
*H01L 23/31* (2006.01)

(52) U.S. Cl.
CPC ........ *H01L 21/486* (2013.01); *H01L 23/3121* (2013.01); *H01L 23/49827* (2013.01)

(58) Field of Classification Search
CPC ............... B23K 26/402; H01L 21/486; H01L 21/67121; H01L 23/16; H01L 23/3107; H01L 23/3121; H01L 23/49827
USPC .................................................... 219/121.62
See application file for complete search history.

(56) References Cited

U.S. PATENT DOCUMENTS

| | | |
|---|---|---|
| 5,268,194 A | 12/1993 | Kawakami et al. |
| 5,353,195 A | 10/1994 | Fillion et al. |
| 5,367,143 A | 11/1994 | White, Jr. |
| 5,374,788 A | 12/1994 | Endoh et al. |
| 5,474,834 A | 12/1995 | Tanahashi et al. |
| 5,670,262 A | 9/1997 | Dalman |
| 5,767,480 A | 6/1998 | Anglin et al. |
| 5,783,870 A | 7/1998 | Mostafazadeh et al. |
| 5,841,102 A | 11/1998 | Noddin |
| 5,878,485 A | 3/1999 | Wood et al. |
| 6,039,889 A | 3/2000 | Zhang et al. |
| 6,087,719 A | 7/2000 | Tsunashima |
| 6,117,704 A | 9/2000 | Yamaguchi et al. |
| 6,211,485 B1 | 4/2001 | Burgess |
| 6,384,473 B1 | 5/2002 | Peterson et al. |
| 6,388,202 B1 | 5/2002 | Swirbel et al. |
| 6,388,207 B1 | 5/2002 | Figueroa et al. |
| 6,459,046 B1 | 10/2002 | Ochi et al. |
| 6,465,084 B1 | 10/2002 | Curcio et al. |
| 6,489,670 B1 | 12/2002 | Peterson et al. |
| 6,495,895 B1 | 12/2002 | Peterson et al. |
| 6,506,632 B1 | 1/2003 | Cheng et al. |
| 6,512,182 B2 | 1/2003 | Takeuchi et al. |
| 6,538,312 B1 | 3/2003 | Peterson et al. |
| 6,555,906 B2 | 4/2003 | Towle et al. |
| 6,576,869 B1 | 6/2003 | Gower et al. |
| 6,593,240 B1 | 7/2003 | Page |
| 6,631,558 B2 | 10/2003 | Burgess |
| 6,661,084 B1 | 12/2003 | Peterson et al. |
| 6,713,719 B1 | 3/2004 | De Steur et al. |
| 6,724,638 B1 | 4/2004 | Inagaki et al. |
| 6,775,907 B1 | 8/2004 | Boyko et al. |
| 6,781,093 B2 | 8/2004 | Conlon et al. |
| 6,799,369 B2 | 10/2004 | Ochi et al. |
| 6,894,399 B2 | 5/2005 | Vu et al. |
| 7,028,400 B1 | 4/2006 | Hiner et al. |
| 7,062,845 B2 | 6/2006 | Burgess |
| 7,064,069 B2 | 6/2006 | Draney et al. |
| 7,078,788 B2 | 7/2006 | Vu et al. |
| 7,091,589 B2 | 8/2006 | Mori et al. |
| 7,091,593 B2 | 8/2006 | Ishimaru et al. |
| 7,105,931 B2 | 9/2006 | Attarwala |
| 7,129,117 B2 | 10/2006 | Hsu |
| 7,166,914 B2 | 1/2007 | DiStefano et al. |
| 7,170,152 B2 | 1/2007 | Huang et al. |
| 7,192,807 B1 | 3/2007 | Huemoeller et al. |
| 7,211,899 B2 | 5/2007 | Taniguchi et al. |
| 7,271,012 B2 | 9/2007 | Anderson |
| 7,274,099 B2 | 9/2007 | Hsu |
| 7,276,446 B2 | 10/2007 | Robinson et al. |
| 7,279,357 B2 | 10/2007 | Shimoishizaka et al. |
| 7,312,405 B2 | 12/2007 | Hsu |
| 7,321,164 B2 | 1/2008 | Hsu |
| 7,449,363 B2 | 11/2008 | Hsu |
| 7,458,794 B2 | 12/2008 | Schwaighofer et al. |
| 7,511,365 B2 | 3/2009 | Wu et al. |
| 7,690,109 B2 | 4/2010 | Mori et al. |
| 7,714,431 B1 | 5/2010 | Huemoeller et al. |
| 7,723,838 B2 | 5/2010 | Takeuchi et al. |
| 7,754,530 B2 | 7/2010 | Wu et al. |
| 7,808,799 B2 | 10/2010 | Kawabe et al. |
| 7,839,649 B2 | 11/2010 | Hsu |
| 7,843,064 B2 | 11/2010 | Kuo et al. |
| 7,852,634 B2 | 12/2010 | Sakamoto et al. |
| 7,855,460 B2 | 12/2010 | Kuwajima |
| 7,868,464 B2 | 1/2011 | Kawabata et al. |
| 7,887,712 B2 | 2/2011 | Boyle et al. |
| 7,914,693 B2 | 3/2011 | Jeong et al. |
| 7,915,737 B2 | 3/2011 | Nakasato et al. |
| 7,932,595 B1 | 4/2011 | Huemoeller et al. |
| 7,932,608 B2 | 4/2011 | Tseng et al. |
| 7,955,942 B2 | 6/2011 | Pagaila et al. |
| 7,978,478 B2 | 7/2011 | Inagaki et al. |
| 7,982,305 B1 | 7/2011 | Railkar et al. |
| 7,988,446 B2 | 8/2011 | Yeh et al. |
| 8,069,560 B2 | 12/2011 | Mori et al. |
| 8,137,497 B2 | 3/2012 | Sunohara et al. |
| 8,283,778 B2 | 10/2012 | Trezza |
| 8,314,343 B2 | 11/2012 | Inoue et al. |
| 8,367,943 B2 | 2/2013 | Wu et al. |
| 8,384,203 B2 | 2/2013 | Toh et al. |
| 8,390,125 B2 | 3/2013 | Tseng et al. |
| 8,426,246 B2 | 4/2013 | Toh et al. |
| 8,476,769 B2 | 7/2013 | Chen et al. |
| 8,518,746 B2 | 8/2013 | Pagaila et al. |
| 8,536,695 B2 | 9/2013 | Liu et al. |
| 8,628,383 B2 | 1/2014 | Starling et al. |
| 8,633,397 B2 | 1/2014 | Jeong et al. |
| 8,698,293 B2 | 4/2014 | Otremba et al. |
| 8,704,359 B2 | 4/2014 | Tuominen et al. |
| 8,710,402 B2 | 4/2014 | Lei et al. |
| 8,710,649 B1 | 4/2014 | Huemoeller et al. |
| 8,728,341 B2 | 5/2014 | Ryuzaki et al. |
| 8,772,087 B2 | 7/2014 | Barth et al. |
| 8,786,098 B2 | 7/2014 | Wang |
| 8,877,554 B2 | 11/2014 | Tsai et al. |
| 8,890,628 B2 | 11/2014 | Nair et al. |
| 8,907,471 B2 | 12/2014 | Beyne et al. |
| 8,921,995 B1 | 12/2014 | Railkar et al. |
| 8,952,544 B2 | 2/2015 | Lin et al. |
| 8,980,691 B2 | 3/2015 | Lin |
| 8,990,754 B2 | 3/2015 | Bird et al. |
| 8,994,185 B2 | 3/2015 | Lin et al. |
| 8,999,759 B2 | 4/2015 | Chia |
| 9,059,186 B2 | 6/2015 | Shim et al. |
| 9,064,936 B2 | 6/2015 | Lin et al. |
| 9,070,637 B2 | 6/2015 | Yoda et al. |
| 9,099,313 B2 | 8/2015 | Lee et al. |
| 9,111,914 B2 | 8/2015 | Lin et al. |
| 9,142,487 B2 | 9/2015 | Toh et al. |
| 9,159,678 B2 | 10/2015 | Cheng et al. |
| 9,161,453 B2 | 10/2015 | Koyanagi |
| 9,210,809 B2 | 12/2015 | Mallik et al. |
| 9,224,674 B2 | 12/2015 | Malatkar et al. |
| 9,275,934 B2 | 3/2016 | Sundaram et al. |
| 9,318,376 B1 | 4/2016 | Holm et al. |
| 9,355,881 B2 | 5/2016 | Goller et al. |
| 9,363,898 B2 | 6/2016 | Tuominen et al. |
| 9,396,999 B2 | 7/2016 | Yap et al. |
| 9,406,645 B1 | 8/2016 | Huemoeller et al. |
| 9,499,397 B2 | 11/2016 | Bowles et al. |
| 9,530,752 B2 | 12/2016 | Nikitin et al. |
| 9,554,469 B2 | 1/2017 | Hurwitz et al. |
| 9,660,037 B1 | 5/2017 | Zechmann et al. |
| 9,698,104 B2 | 7/2017 | Yap et al. |
| 9,704,726 B2 | 7/2017 | Toh et al. |
| 9,735,134 B2 | 8/2017 | Chen |
| 9,748,167 B1 | 8/2017 | Lin |
| 9,754,849 B2 | 9/2017 | Huang et al. |
| 9,837,352 B2 | 12/2017 | Chang et al. |
| 9,837,484 B2 | 12/2017 | Jung et al. |
| 9,859,258 B2 | 1/2018 | Chen et al. |
| 9,875,970 B2 | 1/2018 | Yi et al. |
| 9,887,103 B2 | 2/2018 | Scanlan et al. |
| 9,887,167 B1 | 2/2018 | Lee et al. |
| 9,893,045 B2 | 2/2018 | Pagaila et al. |

(56) References Cited

U.S. PATENT DOCUMENTS

| | | |
|---|---|---|
| 9,978,720 B2 | 5/2018 | Theuss et al. |
| 9,997,444 B2 | 6/2018 | Meyer et al. |
| 10,014,292 B2 | 7/2018 | Or-Bach et al. |
| 10,037,975 B2 | 7/2018 | Hsieh et al. |
| 10,053,359 B2 | 8/2018 | Bowles et al. |
| 10,090,284 B2 | 10/2018 | Chen et al. |
| 10,109,588 B2 | 10/2018 | Jeong et al. |
| 10,128,177 B2 | 11/2018 | Kamgaing et al. |
| 10,153,219 B2 | 12/2018 | Jeon et al. |
| 10,163,803 B1 | 12/2018 | Chen et al. |
| 10,170,386 B2 | 1/2019 | Kang et al. |
| 10,177,083 B2 | 1/2019 | Kim et al. |
| 10,211,072 B2 | 2/2019 | Chen et al. |
| 10,229,827 B2 | 3/2019 | Chen et al. |
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |
| 10,410,971 B2 | 9/2019 | Rae et al. |
| 10,424,530 B1 | 9/2019 | Alur et al. |
| 10,515,912 B2 | 12/2019 | Lim et al. |
| 10,522,483 B2 | 12/2019 | Shuto |
| 10,553,515 B2 | 2/2020 | Chew |
| 10,570,257 B2 | 2/2020 | Sun et al. |
| 10,658,337 B2 | 5/2020 | Yu et al. |
| 2001/0020548 A1 | 9/2001 | Burgess |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0074615 A1 | 6/2002 | Honda |
| 2002/0135058 A1 | 9/2002 | Asahi et al. |
| 2002/0158334 A1 | 10/2002 | Vu et al. |
| 2002/0170891 A1 | 11/2002 | Boyle et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |
| 2004/0080040 A1 | 4/2004 | Dotta et al. |
| 2004/0118824 A1 | 6/2004 | Burgess |
| 2004/0134682 A1 | 7/2004 | En et al. |
| 2004/0248412 A1 | 12/2004 | Liu et al. |
| 2005/0012217 A1 | 1/2005 | Mori et al. |
| 2005/0170292 A1 | 8/2005 | Tsai et al. |
| 2006/0014532 A1 | 1/2006 | Seligmann et al. |
| 2006/0073234 A1 | 4/2006 | Williams |
| 2006/0128069 A1 | 6/2006 | Hsu |
| 2006/0145328 A1 | 7/2006 | Hsu |
| 2006/0160332 A1* | 7/2006 | Gu ............... B23K 26/082 250/492.2 |
| 2006/0270242 A1 | 11/2006 | Verhaverbeke et al. |
| 2006/0283716 A1 | 12/2006 | Hafezi et al. |
| 2007/0035033 A1 | 2/2007 | Ozguz et al. |
| 2007/0042563 A1 | 2/2007 | Wang et al. |
| 2007/0077865 A1 | 4/2007 | Dysard et al. |
| 2007/0111401 A1 | 5/2007 | Kataoka et al. |
| 2007/0130761 A1 | 6/2007 | Kang et al. |
| 2008/0006945 A1 | 1/2008 | Lin et al. |
| 2008/0011852 A1 | 1/2008 | Gu et al. |
| 2008/0090095 A1 | 4/2008 | Nagata et al. |
| 2008/0113283 A1 | 5/2008 | Ghoshal et al. |
| 2008/0119041 A1 | 5/2008 | Magera et al. |
| 2008/0173792 A1 | 7/2008 | Yang et al. |
| 2008/0173999 A1 | 7/2008 | Chung et al. |
| 2008/0296273 A1 | 12/2008 | Lei et al. |
| 2009/0084596 A1 | 4/2009 | Inoue et al. |
| 2009/0243065 A1 | 10/2009 | Sugino et al. |
| 2009/0250823 A1 | 10/2009 | Racz et al. |
| 2009/0278126 A1 | 11/2009 | Yang et al. |
| 2010/0013081 A1 | 1/2010 | Toh et al. |
| 2010/0062287 A1 | 3/2010 | Beresford et al. |
| 2010/0144101 A1 | 6/2010 | Chow et al. |
| 2010/0148305 A1 | 6/2010 | Yun |
| 2010/0160170 A1 | 6/2010 | Horimoto et al. |
| 2010/0248451 A1 | 9/2010 | Pirogovsky et al. |
| 2010/0264538 A1 | 10/2010 | Swinnen et al. |
| 2010/0301023 A1 | 12/2010 | Unrath et al. |
| 2010/0307798 A1 | 12/2010 | Izadian |
| 2011/0062594 A1 | 3/2011 | Maekawa et al. |
| 2011/0097432 A1 | 4/2011 | Yu et al. |
| 2011/0111300 A1 | 5/2011 | DelHagen et al. |
| 2011/0204505 A1 | 8/2011 | Pagaila et al. |
| 2011/0259631 A1 | 10/2011 | Rumsby |
| 2011/0291293 A1 | 12/2011 | Tuominen et al. |
| 2011/0304024 A1 | 12/2011 | Renna |
| 2011/0316147 A1 | 12/2011 | Shih et al. |
| 2012/0128891 A1 | 5/2012 | Takei et al. |
| 2012/0146209 A1 | 6/2012 | Hu et al. |
| 2012/0164827 A1 | 6/2012 | Rajagopalan et al. |
| 2012/0261805 A1 | 10/2012 | Sundaram et al. |
| 2013/0074332 A1 | 3/2013 | Suzuki |
| 2013/0105329 A1 | 5/2013 | Matejat et al. |
| 2013/0196501 A1 | 8/2013 | Sulfridge |
| 2013/0203190 A1 | 8/2013 | Reed et al. |
| 2013/0286615 A1 | 10/2013 | Inagaki et al. |
| 2013/0341738 A1 | 12/2013 | Reinmuth et al. |
| 2014/0054075 A1 | 2/2014 | Hu |
| 2014/0092519 A1 | 4/2014 | Yang |
| 2014/0094094 A1 | 4/2014 | Rizzuto et al. |
| 2014/0103499 A1 | 4/2014 | Andry et al. |
| 2014/0252655 A1 | 9/2014 | Tran et al. |
| 2014/0353019 A1 | 12/2014 | Arora et al. |
| 2015/0228416 A1 | 8/2015 | Hurwitz et al. |
| 2015/0296610 A1 | 10/2015 | Daghighian et al. |
| 2015/0311093 A1 | 10/2015 | Li et al. |
| 2015/0359098 A1 | 12/2015 | Ock |
| 2015/0380356 A1 | 12/2015 | Chauhan et al. |
| 2016/0013135 A1 | 1/2016 | He et al. |
| 2016/0020163 A1 | 1/2016 | Shimizu et al. |
| 2016/0049371 A1 | 2/2016 | Lee et al. |
| 2016/0088729 A1 | 3/2016 | Kobuke et al. |
| 2016/0095203 A1 | 3/2016 | Min et al. |
| 2016/0118337 A1 | 4/2016 | Yoon et al. |
| 2016/0270242 A1 | 9/2016 | Kim et al. |
| 2016/0276325 A1 | 9/2016 | Nair et al. |
| 2016/0329299 A1 | 11/2016 | Lin et al. |
| 2016/0336296 A1 | 11/2016 | Jeong et al. |
| 2017/0047308 A1 | 2/2017 | Ho et al. |
| 2017/0064835 A1 | 3/2017 | Ishihara et al. |
| 2017/0223842 A1 | 8/2017 | Chujo et al. |
| 2017/0229432 A1 | 8/2017 | Lin et al. |
| 2017/0338254 A1 | 11/2017 | Reit et al. |
| 2018/0019197 A1 | 1/2018 | Boyapati et al. |
| 2018/0116057 A1 | 4/2018 | Kajihara et al. |
| 2018/0182727 A1 | 6/2018 | Yu |
| 2018/0197831 A1 | 7/2018 | Kim et al. |
| 2018/0204802 A1 | 7/2018 | Lin et al. |
| 2018/0308792 A1 | 10/2018 | Raghunathan et al. |
| 2018/0352658 A1 | 12/2018 | Yang |
| 2018/0374696 A1 | 12/2018 | Chen et al. |
| 2018/0376589 A1 | 12/2018 | Harazono |
| 2019/0088603 A1 | 3/2019 | Marimuthu et al. |
| 2019/0131224 A1 | 5/2019 | Choi et al. |
| 2019/0131270 A1 | 5/2019 | Lee et al. |
| 2019/0131284 A1 | 5/2019 | Jeng et al. |
| 2019/0189561 A1 | 6/2019 | Rusli |
| 2019/0229046 A1 | 7/2019 | Tsai et al. |
| 2019/0237430 A1 | 8/2019 | England |
| 2019/0285981 A1 | 9/2019 | Cunningham et al. |
| 2019/0306988 A1 | 10/2019 | Grober et al. |
| 2019/0355680 A1 | 11/2019 | Chuang et al. |
| 2019/0369321 A1 | 12/2019 | Young et al. |
| 2020/0003936 A1 | 1/2020 | Fu et al. |
| 2020/0039002 A1* | 2/2020 | Sercel ............... B23K 26/083 |
| 2020/0130131 A1 | 4/2020 | Togawa et al. |
| 2020/0357947 A1 | 11/2020 | Chen et al. |
| 2020/0358163 A1 | 11/2020 | See et al. |

FOREIGN PATENT DOCUMENTS

| | | |
|---|---|---|
| CN | 100463128 C | 2/2009 |
| CN | 100502040 C | 6/2009 |
| CN | 100524717 C | 8/2009 |

(56) References Cited

FOREIGN PATENT DOCUMENTS

| | | |
|---|---|---|
| CN | 100561696 C | 11/2009 |
| CN | 104637912 A | 5/2015 |
| CN | 105436718 A | 3/2016 |
| CN | 106531647 A | 3/2017 |
| CN | 106653703 A | 5/2017 |
| CN | 108028225 A | 5/2018 |
| CN | 111492472 A | 8/2020 |
| EP | 0264134 A2 | 4/1988 |
| EP | 1536673 A1 | 6/2005 |
| EP | 1478021 B1 | 7/2008 |
| EP | 1845762 B1 | 5/2011 |
| EP | 2942808 A1 | 11/2015 |
| JP | 2001244591 A | 9/2001 |
| JP | 2002246755 A | 8/2002 |
| JP | 2003188340 A | 7/2003 |
| JP | 2004311788 A | 11/2004 |
| JP | 2004335641 A | 11/2004 |
| JP | 4108285 B2 | 6/2008 |
| JP | 2012069926 A | 4/2012 |
| JP | 5004378 B2 | 8/2012 |
| JP | 5111342 B2 | 1/2013 |
| JP | 5693977 B2 | 4/2015 |
| JP | 5700241 B2 | 4/2015 |
| JP | 5981232 B2 | 8/2016 |
| JP | 6394136 B2 | 9/2018 |
| JP | 6542616 B2 | 7/2019 |
| JP | 6626697 B2 | 12/2019 |
| KR | 100714196 B1 | 5/2007 |
| KR | 100731112 B1 | 6/2007 |
| KR | 10-2008-0037296 A | 4/2008 |
| KR | 2008052491 A | 6/2008 |
| KR | 20100097893 A | 9/2010 |
| KR | 101301507 B1 | 9/2013 |
| KR | 20140086375 A | 7/2014 |
| KR | 101494413 B1 | 2/2015 |
| KR | 20160013706 A | 2/2016 |
| KR | 20180113885 A | 10/2018 |
| KR | 101922884 B1 | 11/2018 |
| KR | 101975302 B1 | 8/2019 |
| KR | 102012443 B1 | 8/2019 |
| TW | I594397 B | 8/2017 |
| WO | 2011130300 A1 | 10/2011 |
| WO | 2013008415 A1 | 1/2013 |
| WO | 2013126927 A2 | 8/2013 |
| WO | 2015126438 A1 | 8/2015 |
| WO | 2017111957 A1 | 6/2017 |
| WO | 2018013122 A1 | 1/2018 |
| WO | 2018125184 A1 | 7/2018 |
| WO | 2019023213 A1 | 1/2019 |
| WO | 2019066988 A1 | 4/2019 |
| WO | 2019/177742 A1 | 9/2019 |

OTHER PUBLICATIONS

PCT International Search Report and Written Opinion dated Feb. 4, 2022, for International Application No. PCT/US2021/053821.

U.S. Office Action dated May 13, 2021, in U.S. Appl. No. 16/870,843.

Chen, Qiao—"Modeling, Design and Demonstration of Through-Package-Vias in Panel-Based Polycrystalline Silicon Interposers for High Performance, High Reliability and Low Cost," a Dissertation presented to the Academic Faculty, Georgia Institute of Technology, May 2015, 168 pages.

Lannon, John Jr., et al.—"Fabrication and Testing of a TSV-Enabled Si Interposer with Cu- and Polymer-Based Multilevel Metallization," IEEE Transactions on Components, Packaging and Manufacturing Technology, vol. 4, No. 1, Jan. 2014, pp. 153-157.

Malta, D., et al.—"Fabrication of TSV-Based Silicon Interposers," 3D Systems Integration Conference (3DIC), 2010 IEEE International, Nov. 16-18, 2010, 6 pages.

Allresist Gmbh—Strausberg et al: "Resist-Wiki: Adhesion promoter HMDS and diphenylsilanedio (AR 300-80)—. . . —Allresist GmbH—Strausberg, Germany", Apr. 12, 2019 (Apr. 12, 2019), XP055663206, Retrieved from the Internet: URL:https://web.archive.org/web/2019041220micals-adhesion-promoter-hmds-and-diphenyl2908/ https://www.allresist.com/process-chemicals-adhesion-promoter-hmds-and-diphenylsilanedio/, [retrieved on Jan. 29, 2020].

Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).

Arifur Rahman. "System-Level Performance Evaluation of Three-Dimensional Integrated Circuits", vol. 8, No. 6, Dec. 2000. pp. 671-678.

Baier, T. et al., Theoretical Approach to Estimate Laser Process Parameters for Drilling in Crystalline Silicon, Prog. Photovolt: Res. Appl. 18 (2010) 603-606, 5 pages.

Chien-Wei Chien et al "Chip Embedded Wafer Level Packaging Technology for Stacked RF-SiP Application", 2007 IEEE, pp. 305-310.

Chien-Wei Chien et al. "3D Chip Stack With Wafer Through Hole Technology". 6 pages.

Daquan Yu, "Embedded Silicon Fan?Out (eSiFO®) Technology for Wafer?Level System Integration", 2019 Advances in Embedded and Fan-Out Wafer-Level Packaging Technologies, First Edition. pp. 169-184.

Doany, F.E., et al.—"Laser release process to obtain freestanding multilayer metal-polyimide circuits," IBM Journal of Research and Development, vol. 41, Issue 1/2, Jan./Mar. 1997, pp. 151-157.

Dyer, P.E., et al.—"Nanosecond photoacoustic studies on ultraviolet laser ablation of organic polymers," Applied Physics Letters, vol. 48, No. 6, Feb. 10, 1986, pp. 445-447.

Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.].

Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179.].

Han, Younggun, et al.—"Evaluation of Residual Stress and Warpage of Device Embedded Substrates with Piezo-Resistive Sensor Silicon Chips" technical paper, Jul. 31, 2015, pp. 81-94.

International Search Report and the Written Opinion for International Application No. PCT/US2019/064280 dated Mar. 20, 2020, 12 pages.

International Search Report and Written Opinion for Application No. PCT/US2020/026832 dated Jul. 23, 2020.

Italian search report and written opinion for Application No. IT 201900006736 dated Mar. 2, 2020.

Italian Search Report and Written Opinion for Application No. IT 201900006740 dated Mar. 4, 2020.

Junghoon Yeom', et al. "Critical Aspect Ratio Dependence in Deep Reactive Ion Etching of Silicon", 2003 IEEE. pp. 1631-1634.

K. Sakuma et al. "3D Stacking Technology with Low-Volume Lead-Free Interconnections", IBM T.J. Watson Research Center. 2007 IEEE, pp. 627-632.

Kenji Takahashi et al. "Current Status of Research and Development for Three-Dimensional Chip Stack Technology", Jpn. J. Appl. Phys. vol. 40 (2001) pp. 3032-3037, Part 1, No. 4B, Apr. 2001. 6 pages.

Kim et al. "A Study on the Adhesion Properties of Reactive Sputtered Molybdenum Thin Films with Nitrogen Gas on Polyimide Substrate as a Cu Barrier Layer," 2015, Journal of Nanoscience and Nanotechnology, vol. 15, No. 11, pp. 8743-8748, doi: 10.1166/jnn.2015.11493.

Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.

Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.

(56) References Cited

OTHER PUBLICATIONS

Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.
L. Wang, et al. "High aspect ratio through-wafer interconnections for 3Dmicrosystems", 2003 IEEE. pp. 634-637.
Lee et al. "Effect of sputtering parameters on the adhesion force of copper/molybdenum metal on polymer substrate," 2011, Current Applied Physics, vol. 11, pp. S12-S15, doi: 10.1016/j.cap.2011.06.019.
Liu, C.Y. et al., Time Resolved Shadowgraph Images of Silicon during Laser Ablation: Shockwaves and Particle Generation, Journal of Physics: Conference Series 59 (2007) 338-342, 6 pages.
Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.
NT Nguyen et al. "Through-Wafer Copper Electroplating for Three-Dimensional Interconnects", Journal of Micromechanics and Microengineering. 12 (2002) 395-399. 2002 IOP.
PCT International Search Report and Written Opinion dated Aug. 28, 2020, for International Application No. PCT/US2020/032245.
PCT International Search Report and Written Opinion dated Sep. 15, 2020, for International Application No. PCT/US2020/035778.
Ronald Hon et al. "Multi-Stack Flip Chip 3D Packaging with Copper Plated Through-Silicon Vertical Interconnection", 2005 IEEE. pp. 384-389.
S. W. Ricky Lee et al. "3D Stacked Flip Chip Packaging with Through Silicon Vias and Copper Plating or Conductive Adhesive Filling", 2005 IEEE, pp. 798-801.
Shen, Li-Cheng, et al.—"A Clamped Through Silicon Via (TSV) Interconnection for Stacked Chip Bonding Using Metal Cap on Pad and Metal col. Forming in Via," Proceedings of 2008 Electronic Components and Technology Conference, pp. 544-549.
Shi, Tailong, et al.—"First Demonstration of Panel Glass Fan-out (GFO) Packages for High I/O Density and High Frequency Multichip Integration," Proceedings of 2017 IEEE 67th Electronic Components and Technology Conference, May 30-Jun. 2, 2017, pp. 41-46.
Srinivasan, R., et al.—"Ultraviolet Laser Ablation of Organic Polymers," Chemical Reviews, 1989, vol. 89, No. 6, pp. 1303-1316.
Trusheim, D. et al., Investigation of the Influence of Pulse Duration in Laser Processes for Solar Cells, Physics Procedia Dec. 2011, 278-285, 9 pages.
Wu et al., Microelect. Eng., vol. 87 2010, pp. 505-509.
Yu et al. "High Performance, High Density RDL for Advanced Packaging," 2018 IEEE 68th Electronic Components and Technology Conference, pp. 587-593, DOI 10.1109/ETCC.2018.0009.
Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.
Tecnisco, Ltd.—"Company Profile" presentation with product introduction, date unknown, 26 pages.
Wang et al. "Study of Direct Cu Electrodeposition on Ultra-Thin Mo for Copper Interconnect", State key lab of ASIC and system, School of microelectronics, Fudan University, Shanghai, China; 36 pages.
International Search Report and Written Opinion dated Oct. 7, 2021 for Application No. PCT/US2021037375.
PCT International Search Report and Written Opinion dated Oct. 19, 2021, for International Application No. PCT/US2021/038690.
Taiwan Office Action dated Oct. 27, 2020 for Application No. 108148588.
PCT International Search Report and Written Opinion dated Feb. 17, 2021 for International Application No. PCT/US2020/057787.
PCT International Search Report and Written Opinion dated Feb. 19, 2021, for International Application No. PCT/US2020/057788.

\* cited by examiner

LASER ABLATION SYSTEM FOR PACKAGE FABRICATION

BACKGROUND

Field

Embodiments of the present disclosure generally relate to systems and methods for fabricating semiconductor packages, and more specifically systems and methods for forming features on packages by laser ablation.

Description of the Related Art

Due to a continual goal of semiconductor manufacturers to increase yield and enhance performance of electronic devices and components, efforts to increase the density of semiconductor devices fabricated on a given size of a semiconductor substrate have been intensified. One method for increasing the density of semiconductor devices in a semiconductor assembly is to stack semiconductor dies to create a three-dimensional multichip module (3-D MCM). The formation of a 3-D MCM typically requires creating vias (i.e., through holes) in at least one semiconductor die that extend from the active surface of the die to the opposing back surface of the die. The vias are filled with an electrically conductive material that provides interconnection of the back surface of the semiconductor die to external electrical contacts of another semiconductor die or a carrier substrate of the 3-D MCM.

Conventionally, etching and laser ablating, or drilling, are two methods frequently used for forming vias in semiconductor substrates. While laser drilling of vias has the advantage of being significantly faster and more positionally and dimensionally accurate than etching of vias, precise control of depth and topography of drilled areas have not yet been achieved by conventional laser drilling. Furthermore, the laser energy is often used inefficiently, thus, leading to low ablation rates.

Accordingly, there is a need for laser drilling systems and methods for rapidly forming vias in semiconductor substrates with controlled depth and topography.

SUMMARY

The present disclosure generally relates to systems and methods for forming features on packages by laser ablation.

In one embodiment, a system for laser patterning a semiconductor device is provided. The system includes a diode-pumped solid-state laser source having a slab gain medium and configured to generate a pulsed laser beam. The laser source is further characterized by a pulse energy between about 0.25 mJ and about 10 mJ, a pulse width between about 1 ns and about 4000 ns, and a pulse frequency between about 1 kHz and about 200 kHz. The system further includes a large angle galvanometer optical scanner and a first telecentric lens having a field of view (FOV) with lateral dimensions substantially equal to or greater than about 137 mm and a working distance between about 30 mm and about 500 mm.

In one embodiment, a system for laser patterning a semiconductor device is provided. The system includes a diode-pumped solid-state laser source having a slab gain medium and configured to generate a pulsed laser beam. The laser source is further characterized by a pulse energy between about 0.25 mJ and about 10 mJ, a pulse width between about 1 ns and about 4000 ns, and a pulse frequency between about 1 kHz and about 200 kHz. The system further includes a large angle galvanometer optical scanner, a first telecentric lens having a field of view (FOV) with lateral dimensions substantially equal to or greater than about 137 mm and a working distance between about 30 mm and about 500 mm, and an adjustable stage having bi-directional movement. The movement of the stage is synchronized with a movement of the galvanometer optical scanner.

In one embodiment, a system for laser patterning a semiconductor device is provided. The system includes a diode-pumped solid-state laser source having an infrared (IR) slab gain medium and configured to generate a pulsed laser beam. The laser source is further characterized by a pulse energy between about 0.25 mJ and about 10 mJ, a pulse width between about 1 ns and about 4000 ns, and a pulse frequency between about 1 kHz and about 200 kHz. The system further includes a large angle galvanometer optical scanner, a first telecentric lens having a field of view (FOV) with lateral dimensions substantially equal to or greater than about 137 mm and a working distance between about 30 mm and about 500 mm, and an adjustable stage having bi-directional movement and configured to translate from a loading position for laser patterning and an absolute position for calibration of the galvanometer optical scanner. A controller is in communication with the laser source, the galvanometer optical scanner, and the adjustable stage, and is configured to modulate the pulse energy, the pulse width, and the pulse frequency of the laser source.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to systems and methods for fabricating semiconductor packages, and more particularly, for forming features in semiconductor packages by laser ablation. In one embodiment, the laser systems and methods described herein can be utilized to pattern a substrate to be utilized as a package frame for a semiconductor package having one or more interconnections formed therethrough and/or one or more semiconductor dies disposed therein. The laser systems described herein can produce tunable laser beams for forming features in a substrate or other package structure. Specifically, frequency, pulse width, pulse shape, and pulse energy of laser beams are tunable based on desired sizes of patterned features and on the material in which the patterned features are formed. The adjustability of the laser beams enables rapid and accurate formation of features in semiconductor substrates and packages with controlled depth and topography.

As used herein, the term "about" refers to a +/−10% variation from the nominal value. It is to be understood that such variation can be included in any value provided herein.

Figure 1A:
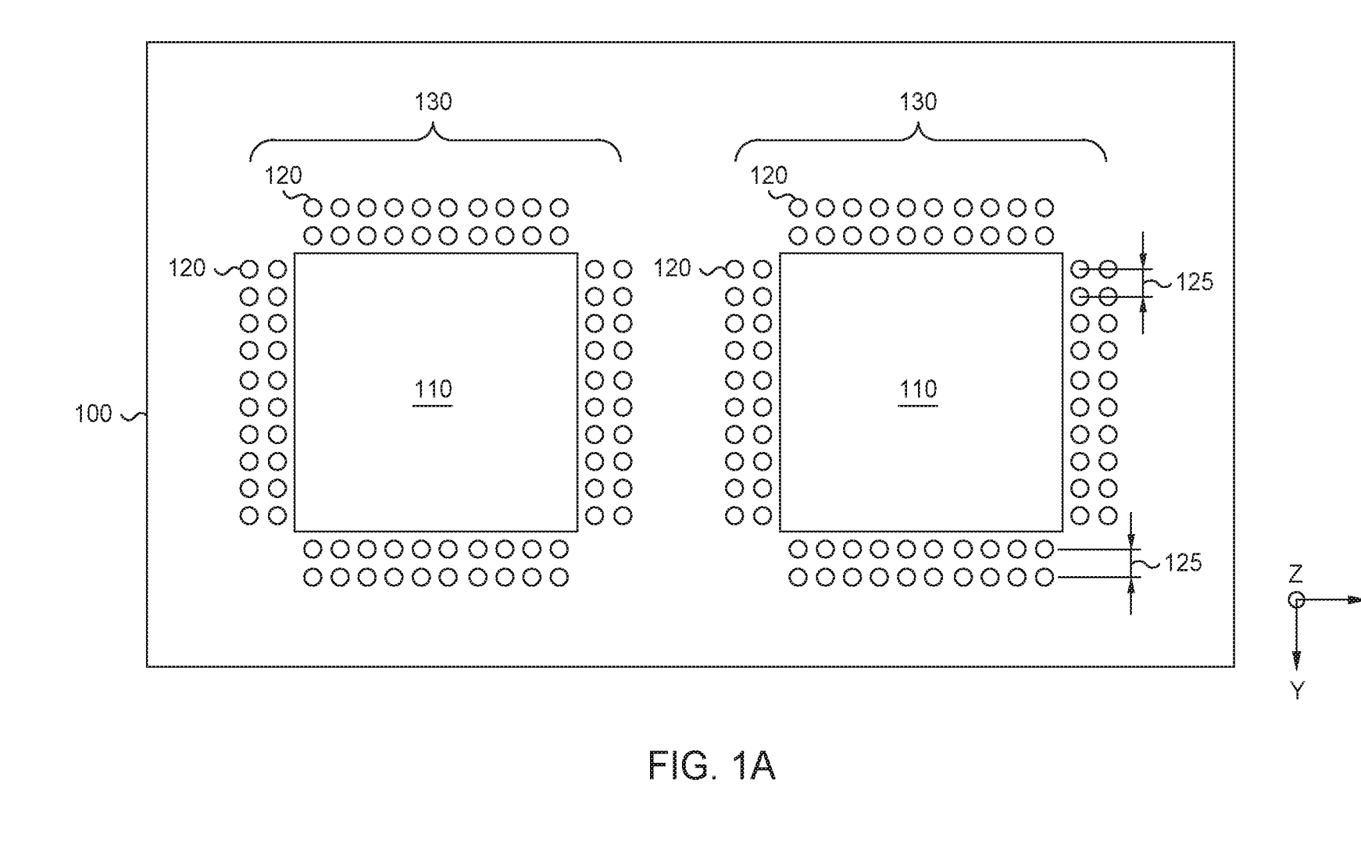
FIG. 1A illustrates a schematic top view of an exemplary structured substrate according to embodiments of the present disclosure.

FIG. 1A illustrates a schematic top view of an exemplary structured substrate 100 that may be formed by the laser systems described herein and utilized as a structural frame for a semiconductor package. The substrate 100 is illustrated as having quadrilateral cavities 110 surrounded by a plurality of substantially cylindrical vias 120, collectively referred to as features 130. The cavities 110 are generally formed in the substrate 100 for subsequent placement and encapsulation of one or more semiconductor devices therein, such as one or more active semiconductor dies or passive components. The vias 120 are formed in the substrate 100 to provide channels or pathways for interconnections to be routed therethrough, thus enabling direct electrical coupling of the interconnections with devices and/or redistribution connections on both sides of the substrate 100.

The cavities 110 and vias 120 may be laser patterned into the substrate 100 having any desired dimensions and shapes and in any desired quantity and arrangement. In certain embodiments, each cavity 110 has lateral dimensions ranging between about 1 mm and about 50 mm, such as about 8.6 mm, depending on the size of one or more semiconductor devices to be enclosed and embedded therein during fabrication of semiconductor packages. In some embodiments, the cavities 110 are sized to have lateral dimensions substantially similar to that of the semiconductor devices to be embedded therein. For example, each cavity 110 is formed having lateral dimensions exceeding those of the semiconductor devices placed therein by less than about 150 μm, such as less than about 120 μm, such as less than about 100 μm. Having a reduced variance in the size of the cavities 110 and the semiconductor devices to be embedded therein reduces the amount of gap-fill material utilized in subsequent package fabrication operations.

In certain embodiments, each via 120 has a diameter ranging between about 50 μm and about 200 μm, such as about 90 μm. A minimum pitch 125 between each via 120 is between about 30 μm and about 170 μm, such as about 40 μm. Generally, the vias 120 have a substantially cylindrical shape, although other morphologies are also contemplated. For example, each via 120 may have a tapered or frustoconical shape.

Figure 1B:
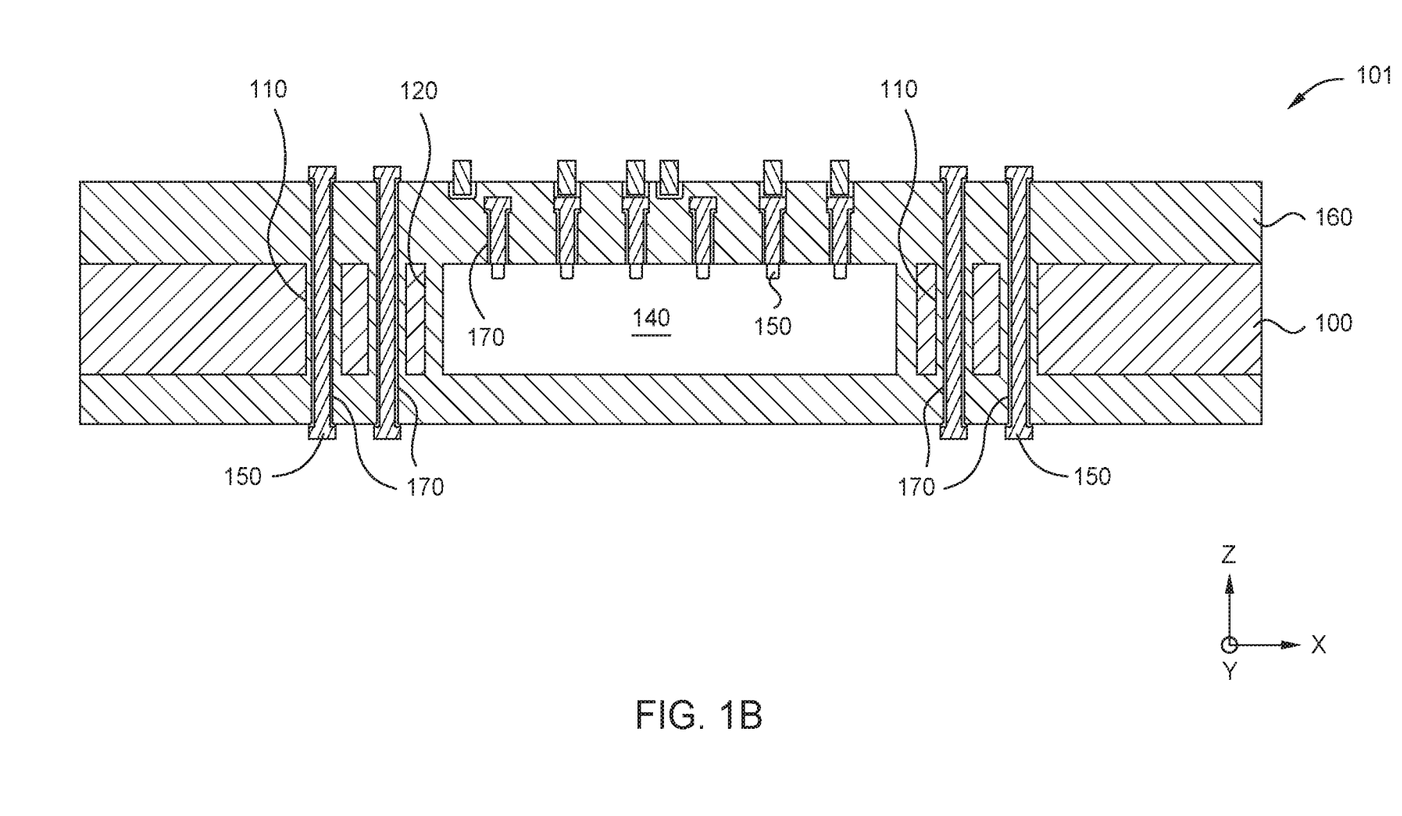
FIG. 1B illustrates a schematic cross-sectional side view of an exemplary package structure according to embodiments of the present disclosure.

FIG. 1B illustrates a schematic cross-sectional side view of the substrate 100 after encapsulation of semiconductor devices 140 within the cavities 110 and plating of interconnections 150 within the vias 120, thus forming a package 101. To embed the semiconductor devices 140 within the cavities 110, the semiconductor devices 140 are placed within the cavities 110 prior to encapsulation by an insulating layer 160, which is laminated and cured thereon. The insulating layer 160 may have a thickness of between about 20 μm and about 70 μm, such as about 30 μm, from a surface of the substrate 100 to an outer surface of the insulating layer 160. In some embodiments, the insulating layer 160 comprises an organic dielectric material, such as Ajinomoto Build-up Film (ABF) and Mitsubishi BT Film. In certain examples, the insulating layer 160 is a ceramic-filler-containing epoxy resin, such as an epoxy resin containing silica ($SiO_2$) particles.

Lamination of the insulating layer 160 causes the dielectric material thereof to flow into and fill voids between the placed semiconductor devices 140 and the substrate 100, as well as into the vias 120. Therefore, in order to form channels or pathways for the interconnections 150 through the entirety of the package 101 after lamination of the insulating layer 160, through-vias 170 (another type of feature 130) are laser drilled through the dielectric material of the insulating layer 160 within the vias 120. Generally, the through-vias 170 have narrower dimensions than the vias 120 such that laser drilling thereof causes the through-vias 170 to be circumferentially surrounded by the insulating layer 160 within the vias 120. In some embodiments, the through-vias have a diameter of between about 20 μm and about 70 μm, such as about 30 μm. By surrounding the through-vias 170 and the subsequently plated interconnections 150 with dielectric material, capacitive coupling between the conductive silicon-based substrate 100 and interconnections 150 in the package 101 may be reduced or eliminated. It should be noted, however, that through-vias 170 may also be formed only partially through the package 101, or within the insulating layer 160 in locations outside the vias 120 in the substrate 100. For example, the through-vias 170 may be formed above or below embedded semiconductor devices 140 for subsequent plating of interconnections 150 to be electrically coupled thereto.

Figure 2:
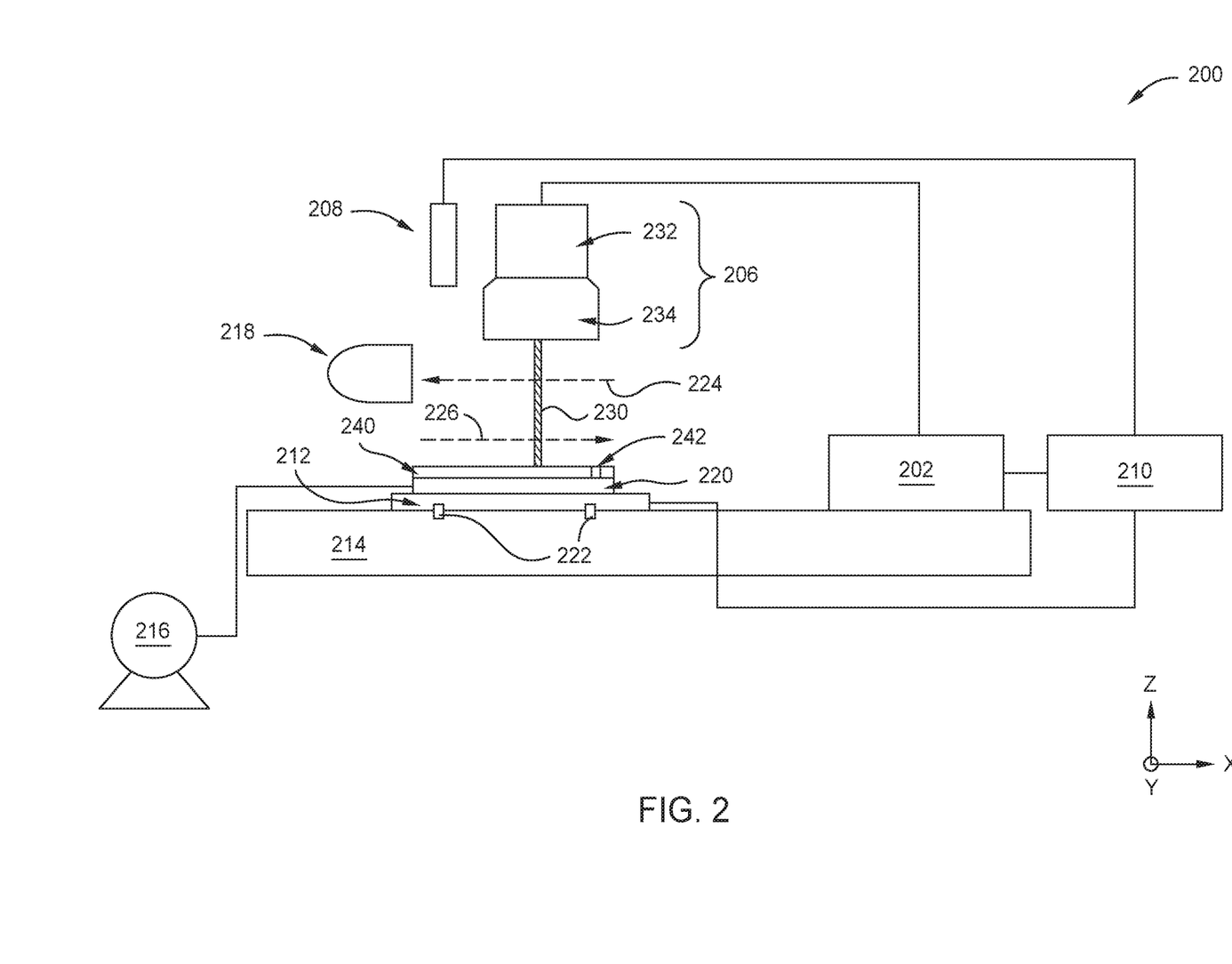
FIG. 2 illustrates a schematic diagram of an exemplary laser system according to embodiments of the present disclosure.

FIG. 2 illustrates a schematic diagram of an exemplary laser system 200 that can be utilized to form desired features 130 (e.g., the vias 120, through-vias 170, and cavities 110) in a sample 240, such as a semiconductor package structure. The laser system 200 is configured to accurately ablate high density, narrow profile features 130 in a variety of package structures and materials, such as silicon-based substrates as well as dielectric epoxy resins. The laser system 200 generally includes a laser source 202, an optical assembly 206, a camera 208, and a controller 210. In certain embodiments, the laser system 200 further includes a stage 212, an optical bench 214, a vacuum source 216, a debris collector 218, and a wafer nest 220.

Generally, the laser source 202 is a solid-state laser, such as a diode-pumped solid-state laser having a slab gain medium, configured to generate a continuous or pulsed laser beam 230 to irradiate a sample 240 for forming one or more features 130 therein. The laser slab may be formed of any suitable laser crystal materials, including neodymium-doped yttrium aluminum garnet (Nd:YAG; Nd:Y3Al5O12), ytterbium-doped YAG (Yb:YAG), neodymium-doped yttrium orthovanadate (Nd:YVO; Nd:YVO4), and alexandrite. In certain embodiments, the laser slab has a face pumping geometry. In certain embodiments, the laser slab has an edge pumping geometry.

In certain embodiments, the laser source 202 operates at infrared (IR) wavelengths (e.g., 1064 nm) for forming features 130 in silicon-containing substrates, such as silicon substrates having thicknesses between about 100 μm and about 1500 μm. In certain other embodiments, the laser source 202 operates at ultraviolet (UV) wavelengths (e.g., 355 nm) for forming features 130 in dielectric materials, such as polymeric epoxy resins. The laser source 202 may generate a pulsed laser beam 230 having a frequency between 1 kHz and 200 kHz. In some examples, the laser source 202 is configured to deliver a pulsed laser beam at a pulse duration between about 1 ns and 5 μs, with a pulse energy of between about 0.10 milli-joules (mJ) and about 10 mJ. In the embodiments described herein, frequency, pulse width, and pulse energy of the laser beam 230 generated by the laser source 202 are tunable (e.g., adjustable) depending on the material being patterned, desired lateral dimensions of the features 130 being drilled, as well as a depth of the features 130 being drilled. Additionally, the movement speed of the laser beam 230, number of pulses, and beam profile and size may be tuned.

For example, for drilling through-vias 170 having a diameter of about 90 μm through a thin silicon-based substrate 100 having a thickness of between about 100 μm and about 200 μm, the laser source 202 may be tuned to have the frequency of between about 5 kHz and about 100 kHz, the pulse energy of between about 0.5 mJ and between about 4.5 mJ, for example, between about 0.8 mJ and about 1.2 mJ at frequency of about 100 kHz, and between about 3.5 mJ and about 4.5 mJ at frequency of about 5 kHz, and the pulse width of between about 100 ns and about 1200 ns. For example, at frequency of about 5 kHz and a pulse width of about 600 ns, material volume of between about 70,000 $\mu m^3$ and about 110,000 $\mu m^3$ is removed per laser pulse. At frequency of about 100 kHz and a pulse width of about 600 ns, material volume of between about 18,000 $\mu m^3$ and about 26,000 $\mu m^3$ is removed per laser pulse. The amount of energy supplied to the material per unit volume is between about 35 $J/mm^3$ and 60 $J/mm^3$.

For drilling through-vias 170 having a diameter of about 90 μm through a thick silicon substrate 102 having a thickness of between about 500 μm and about 1 mm, the laser source 202 may be tuned to have the frequency of between about 5 kHz and about 30 kHz, the pulse energy of between about 2 mJ and about 10 mJ, for example, between about 2 mJ and about 3.5 mJ at frequency of about 30 kHz, and between about 7 mJ and about 10 mJ at frequency of about 5 kHz, and the pulse width of between about 1 μs and about 5 μs.

For drilling cavities 110 having lateral dimensions of about 8.6 mm and depth of between about 50 μm and 200 μm, the laser source 202 may be tuned to have the frequency of between about 5 kHz and about 40 kHz, the pulse energy of between about 0.5 mJ and about 4.5 mJ, and the pulse width of between about 15 ns and about 600 ns. For example, at frequency of about 5 kHz and a pulse width of about 600 ns, material volume of about 30,000 $\mu m^3$ and 50,000 $\mu m^3$ is removed per pulse. At frequency of about 5 kHz and a pulse width of about 2 μs, material volume of about 220,000 $\mu m^3$ and 400,000 $\mu m^3$ is removed per pulse. At frequency of about 30 kHz and a pulse width of about 2 μs, material volume of about 95,000 $\mu m^3$ and about 110,000 $\mu m^3$ is removed per laser pulse. The amount of energy supplied to the material per unit removed is about 60 $J/mm^3$ and 75 $J/mm^3$.

In any form, the laser beam 230 produced by the laser source 202 is projected (e.g., transmitted) towards the sample 240 via the optical assembly 206. The optical assembly 206 is optically coupled with the laser source 202 and includes any suitable image projection devices for directing the laser beam 230 towards the sample 240 for laser patterning of features 130, such as F-theta lenses. In certain embodiments, the optical assembly 206 includes a scanner 232, such as a single- or multi-axis large angle galvanometer optical scanner (i.e., galvo scanner). In certain embodiments, the scanner 232 is a 3-axis galvo scanner having one or more lenses of the optical assembly 206 disposed upstream therefrom on the laser propagation pathway. In certain embodiments, the scanner 232 is a polygon scanner. The term "galvanometer scanner" refers to any device that responds to an electronic signal from the controller 210 to change a projection or reflection angle of the laser beam 230 to sweep the laser beam 230 across the sample 240. Generally, the scanner 232 includes one or more adjustable and electromechanically-controlled mirrors to diverge (e.g., multiply) and/or steer the laser beam 230 across the sample 240 during laser drilling. Utilization of the scanner 232 enables drilling of multiple features 130 in the sample 240 simultaneously, in addition to scanning of the laser beam 230 across a surface of the sample 240 without mechanical translation of the sample 240 itself. The scanner 232 may further include any suitable features to facilitate high density drilling of the materials and structures described herein, such as digital servo feedback, low drift, fast dynamic response, and precise calibration capability.

In certain embodiments, the optical assembly 206 further includes one or more telecentric lenses 234 having a large field of view that encompasses the entirety of the sample 240. For example, the telecentric lens 234 of the optical assembly 206 may have a field of view with lateral dimensions substantially equal to or greater than about 137 mm for purposes of thermal management and lithography matching (discussed below with reference to FIG. 4). The telecentric lens 234 may have a clear aperture between about 30 mm and about 60 mm and is configured to receive a laser beam 230 having a spot size of between about 5 mm and about 20 mm. The telecentric lens 234 may also have a very low distortion degree (i.e., telecentric error) and a large working distance. For example, the telecentric lens 234 may have a telecentric error value of less than about 5°, such as a telecentric error value of less than about 3° or about 1°. In further examples, the telecentric lens 234 has a working distance between about 30 mm and about 500 mm, thus enabling added depth of focus between the optical assembly 206 and the sample 240 without necessitating Z-directional height adjustment.

In certain embodiments, two or more telecentric lenses 234 may be utilized for laser drilling of different types of materials, each telecentric lens 234 specific to a wavelength range of the laser source 202 being utilized for each material type. In such embodiments, the two or more telecentric lenses 234 may have properties matched to each other to enable alignment of features 130 drilled through the different material types. In one example, a first telecentric lens 234 may be utilized for IR drilling in a silicon-based substrate, such as for drilling vias 120 in the substrate 100 described above. Then, upon lamination of the insulating layer 160 over the substrate 100, a second telecentric lens 234 may be utilized for UV drilling in the insulating layer 160, such as for drilling through-vias 170 within the vias 120 of the substrate 100. Matching the properties of the two telecentric lenses 234 thus enables good alignment of the through-vias 170 within the vias 120, enabling adequate isolation therebetween by the insulating layer 160 and reducing or eliminating the chance of exposing the substrate 100. Examples of properties that can be matched between the different telecentric lenses 234 include focal length, field size, max telecentricity error, mechanical scan angle per mirror of the corresponding scanner 232, lens length, lens diameter, working distance, and nominal spot size, to name a few.

During operation, the laser beam 230 projected by the optical assembly 206 is directed towards the sample 240 disposed upon the stage 212. Generally, the stage 212 provides a receiving surface for the sample 240, which may be a substrate having lateral dimensions of about 156 mm by 156 mm or greater. The stage 212 is coupled to the optical bench 214 and may be supported thereon by one or more pairs of tracks 222. In certain embodiments, the tracks 222 are arranged in linear pairs enabling translation of the stage 212 in an X-direction and/or a Y-direction. For example, the tracks 222 may include linear and parallel magnetic channels. In certain other embodiments, the tracks 222 may have a non-linear shape. During operation, the stage 212 moves in the X-direction and/or Y-direction from a loading position to a processing position. Loading and/or unloading of the sample 240 onto the stage 212 in is done by the utilization of one or more transfer devices (not shown), enabling the automatic handling of thin and/or fragile substrates. For example, the sample 240 may be loaded utilizing robotic arms with Bernoulli-type grippers, walking beams, soft-lifting jacks, or the like. The processing position may refer to one or more positions of the stage 212 as the stage 212 passes under the optical assembly 206 of the laser system 200 in a process direction. In certain embodiments, movement of the stage 212 is synchronized with movement of the scanner 232 to enable efficient transitioning between loading and unloading of the sample 240 and scanning of the laser beam 230 for laser drilling of the sample 240.

An encoder (not shown), such as a linear stage encoder, may further be coupled to the stage 212 in order to provide location information of the stage 212 and/or wafer nest 220 to the controller 210 before and/or during laser drilling processes. Additionally, the sample 240 or a calibration substrate (not shown) may include one or more physical markings or features 242, such as a cross-hair, circle, grid-like marking, or through-sample fiducial formed at least on an upper surface thereof, for visual tracking thereof and/or calibration of the laser system 200 by the controller 210 and the camera 208 pointed at the stage 212. For example, the camera 208 may continuously capture images of the sample 240 and the stage 212 for measurement of the X and Y lateral position coordinates thereof by the controller 210 in real time, thus facilitating precise and accurate laser drilling of features 130 in the sample 240.

The stage 212 and/or wafer nest 220 are fluidly coupled to a vacuum source 216, such as a dedicated vacuum pump, which provides a vacuum thereto. The vacuum source 216 may include a throttle valve (not shown) to regulate the amount of vacuum provided. In certain embodiments, the vacuum source 216 is utilized to chuck the sample 240, such as a silicon-based substrate or package structure, to the stage 212 and/or wafer nest 220 during laser drilling and provide a planar drilling surface therefrom. For example, the vacuum source 216 may chuck the sample 240 to the stage 212 and/or wafer nest 220 and prevent warpage caused by temperature elevation from the laser drilling process. In certain embodiments, the vacuum source 216 provides a vacuum pressure of about 100 mbar or less to chuck the sample 240 to the stage 212.

The controller 210 may include a central processing unit (CPU) (not shown), memory (not shown), and support circuits (or I/O) (not shown). The CPU may be one of any form of computer processors that are used in industrial settings for controlling various processing and hardware (e.g., laser sources, optical assemblies, scanners, stage motors, and other hardware) and monitor the processes (e.g., processing time, stage and/or wafer nest position, and substrate position). The memory (not shown) is connected to the CPU, and may be one or more of readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/out circuitry, subsystems, and the like. A program (or computer instructions) readable by the controller determines which tasks are performable on the sample 240, such as a silicon-based substrate. The program may be software readable by the controller and may include code to monitor and control (e.g., switch between), for example, the laser beam 230 characteristics (frequency, pulse width, and pulse energy) and movement of the stage 212 and/or scanner 204.

In certain embodiments, the laser system 200 further includes a debris collector 218 disposed within a processing region thereof and fluidly coupled to a vacuum source, such as vacuum source 216. The debris collector 218 provides a vacuum to the processing region to create a cross-flow 224 of circulated gas for the removal of debris formed during laser ablation of the sample 240. In certain embodiments, the cross-flow 224 provided by the debris collector 218 is antiparallel to a process direction 226 of the laser system 200 (e.g., direction of movement of the stage 212 and/or scanner 204 during processing).

Figure 3:
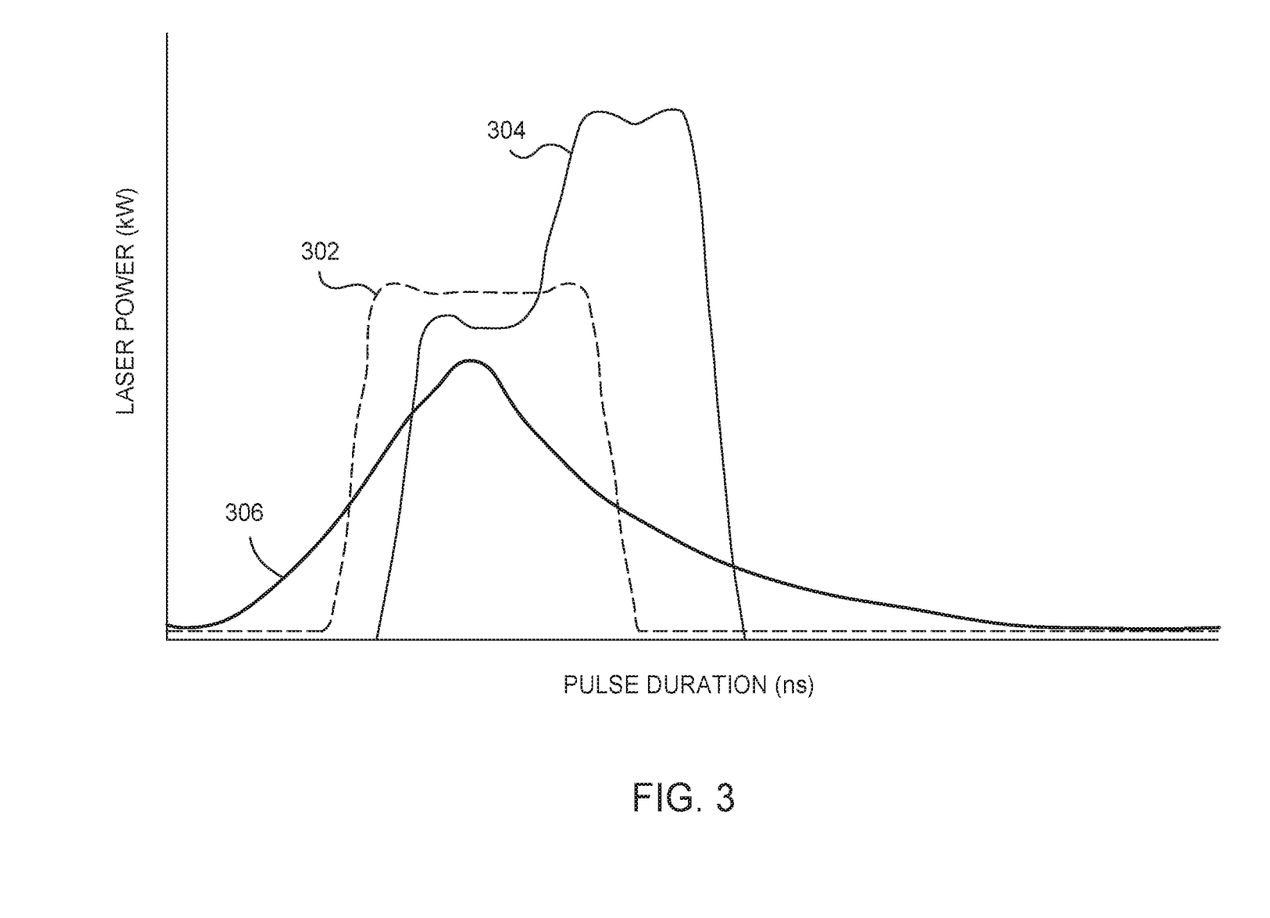
FIG. 3 illustrates temporal profiles of instantaneous laser power of a pulsed laser beam according to embodiments of the present disclosure.

FIG. 3 illustrates temporal profiles of instantaneous laser power of a pulsed laser beam, such as laser beam 230, which may be programmed by the controller 210. While not intending to be bound by theory, it is believed that during laser ablation processes of the sample 240, material being drilled melts and a fraction of the molten material in a liquid state vaporizes to develop hot plasma. This plasma plume tends to be opaque to laser beams, and thus the rate that laser beams can be delivered to the material being drilled is limited by this "plasma screening" effect. However, this plasma screening effect can be reduced if the laser is pulsed and the pulse energy of the laser beam is distributed over a longer pulse duration. Accordingly, a significant amount of the pulse energy may be used to melt the material being drilled without vaporizing the molten material and thus, the rate of laser drilling can be enhanced by applying a pulsed laser having a longer pulse width as compared to laser pulses with a shorter pulse width.

In some embodiments, the pulsed laser beam 230 emitted from the laser source 202 is programmed to have a rectangular temporal profile 302 of instantaneous laser power, as shown in FIG. 3, by methods known in the art. The rectangular temporal profile 302 of instantaneous laser power ensures a moderate heating rate to avoid overheating (i.e., vaporizing molten material) and enhances the efficiency of laser drilling. In some embodiments, the pulsed laser beam 230 emitted from the laser source 202 is programmed to have a chair-shaped temporal profile 304 of instantaneous laser power, as shown in FIG. 3, by methods known in the art, which may further enhance the efficiency of laser drilling. Features 130 drilled by the pulsed laser beam 230 with a rectangular temporal profile 302 generally have straighter and smoother inner walls as compared to features 130 drilled by laser pulses having a classical Q-switch temporal profile 306, as shown in FIG. 3. It should be noted, that the laser source 202 is programmed to produce multiple pulse widths and/or temporal shapes for the laser beam 230, which may be selected (e.g., switched between) by the controller 210.

As noted above, excess laser energy beyond the requirement for melting the material results in partial vaporization. Thus, programming pulses of the laser beam 230 to have a pulse energy content weighted towards the back end of the laser pulses may also have a beneficial effect. In the early part of a pulse, slow energy delivery due to a moderate heating rate melts a larger volume of the material being drilled. This compares and contrasts with laser drilling with a laser pulse having a classical Q-switch temporal profile 306, in which the temporal profile peaks relatively early in the pulse, delivering high energy at a time (early in the pulse) when lower energy is required. Thus, a larger fraction of the laser pulse energy is consumed in excess vaporization and possible ionization of the ablation plume. Programming laser pulses with the temporal profile 302 or the chair-shaped temporal profile 304 allows efficient laser drilling without consuming the laser energy early in the pulses in vaporizing molten materials that are being drilled. In certain embodiments, the ratio of energy density in the first half of a laser pulse (A) as compared to the total energy density of the laser pulse (B) is between about 0.2 and about 0.8 (A/(A+B)=0.2-0.8).

Additionally, the inventors of the present disclosure have also found that straightness and smoothness of inner walls of a feature 130, such as a via 120 and/or through-via 170, are largely related to an ablation depth per laser pulse. The ablation depth increases with optical penetration depth, thermal penetration depth, and laser fluence (i.e., energy per unit area). With a near IR laser having a wavelength of about 1.0 μm used in the example embodiments described herein, a long pulse width ensures the optical penetration depth (that is proportional to a square root of a pulse width) to be sufficiently large. Therefore, the laser pulse energy is more uniformly distributed over a long distance through a substrate, so as to simultaneously heat up and melt a thick substrate material, leading to more efficient ablation. The ablated material has a large momentum (i.e., mass multiplied by speed) and a more directional motion that favors ejecting out of the hole without being re-deposited on the inner walls, leading to straighter and smoother inner walls of a hole being drilled. This is in contrast with an intensive ablation by a laser with a shorter wavelength (such as a 355 nm UV laser) and a shorter pulse width, in which only a surface of a substrate is ablated. In ablation with a laser with such short pulse width, a much smaller amount of material is ablated, but ablated explosively as a mixture of overheated melt, vapor, and plasma, having a much less directional ejection out of a hole being drilled and inducing re-deposition on inner walls of the hole.

Figure 4:
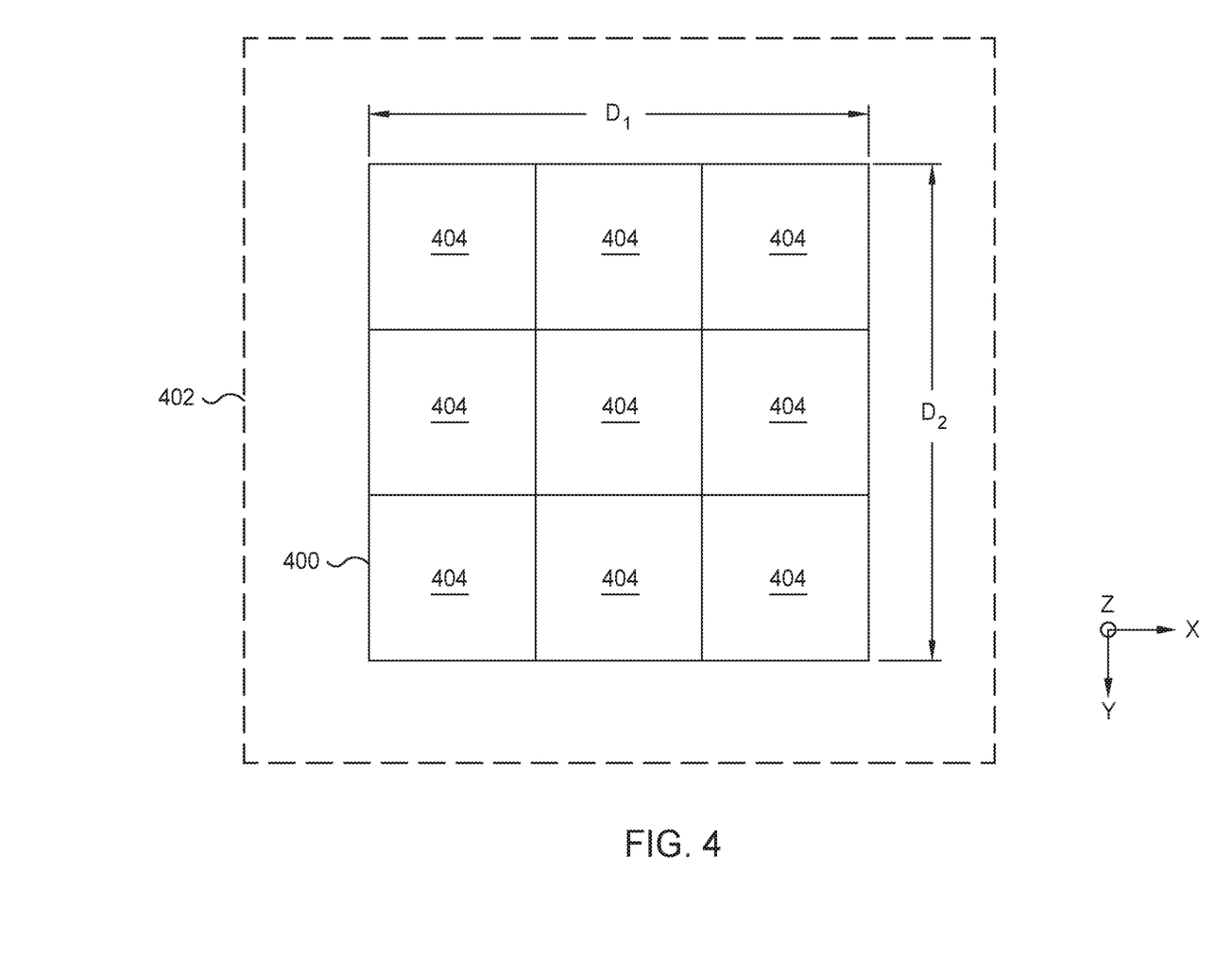
FIG. 4 illustrates a schematic diagram of a field of view of the laser system of FIG. 2 according to embodiments of the present disclosure.

FIG. 4 illustrates a schematic diagram of the drilling field of view (FOV) 402 (shown in phantom) of the telecentric lens 234 in relation to a substrate 400 having lateral dimensions $D_1$, $D_2$ of about 156 mm or less, each. As previously described, the drilling FOV 402 of the telecentric lens 234 is larger than a lateral area of the sample to be laser drilled, such as the substrate 400. The larger drilling FOV 402 allows the entire substrate 400 to be scanned by the scanner 232 without mechanical motion of the substrate 400, such as by the stage 212. Accordingly, stitching of multiple FOVS or sections of the substrate 400 is not required, enabling more robust alignment and a shorter cycle time for laser drilling, and all features 130 drilled into the substrate 400 may be formed in an orientation normal to a surface of the telecentric lens 234.

FIG. 4 also illustrates the drilling FOV 402 of the telecentric lens 234 in relation to a plurality of smaller lithography FOVs 404 utilized in subsequent processing steps of a substrate 400 during package fabrication. As shown, the drilling FOV 402 extends across all of the lithography FOVs 404 and thus, eliminates the occurrence of litho printing over any mispositioned features 130 formed during laser drilling. In certain embodiments, the drilling FOV 402 is a quantitative multiple of the lithography FOVs 404, thus facilitating proper alignment. As a result, no matching between the drilling FOV 402 and the lithography FOVs 404 is required during the processing of the substrate 400.

The telecentric lens 234 further enables on-the-fly drilling cycles to be performed and repeated across an entire surface of the substrate 400 without mechanical translation of the substrate 400. During on-the-fly drilling, the pulsed laser beam 230 is scanned across the surface of the substrate 400 by the scanner 232 to drill subsets of features 130 at different locations thereon. At each location and/or subset of features 130, one or more pulses of the laser beam 230 may be delivered per feature 130 before the scanner 232 translates the laser beam 230 to the next location in the drilling cycle. Upon completion of the drilling cycle (e.g., deliverance of one or more pulses per feature 130 at each location thereof), the laser beam 230 is returned to an initial location of the drilling cycle to deliver one or more additional pulses per feature 130, and the drilling cycle is repeated. Generally, two or more drilling cycles, such as five or more drilling cycles, are utilized to form complete features 130 through a thickness of a sample, such as the substrate 400. Cycling of laser pulses across the surface of the substrate 400 enables each drilling location to cool off between delivery of laser pulses, thus avoiding drilling upon already heated surfaces of the substrate 400, which can cause overheating and decrease drilling efficiency via the "plasma screening" effect described above. With the telecentric lens 234 having an FOV 402 larger than the lateral area of the substrate 400, entire drilling cycles are performed without having to mechanically move the substrate 400, which can increase the risk of sample misalignment or drift and dramatically increase drilling cycle time.

In some embodiments, in an on-the-fly drilling cycle process, the pulsed laser beam 230 is positioned synchronically with a scan motion of a galvo-scanner for high speed beam positioning, for example, at a speed of about 10 m/s, and repeatedly over a sub-set of features 130. The effective drilling repetition rate on any one feature 130 is approximately the laser repetition rate divided by the total number of features 130 being drilled. In some embodiments, a sub-set of features 130 includes between about 1000 and about 2,500,000 features 130 that are drilled by synchronous drilling during an on-the-fly drilling cycle.

Figure 5A:
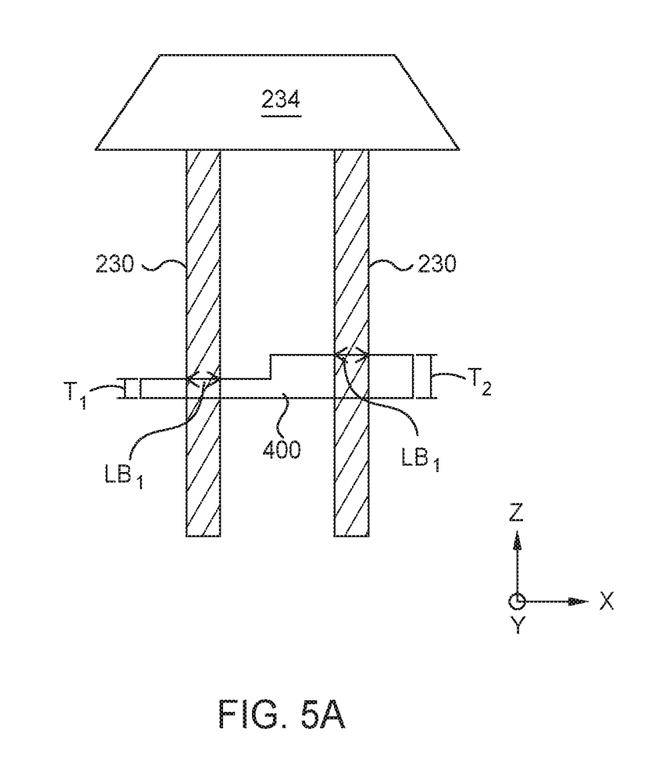
FIG. 5A schematically illustrates the physical profile of a laser beam according to embodiments of the present disclosure.
Figure 5B:
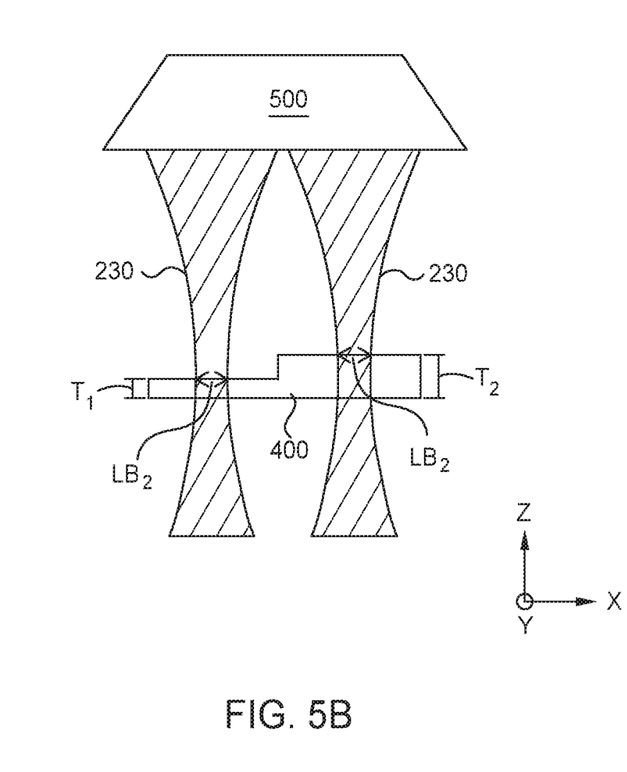
FIG. 5B schematically illustrates the physical profile of a laser beam according to embodiments of the present disclosure.

In addition to providing a larger field of view 402, the telecentric lens 234 also provides an enhanced (e.g., extended) depth of focus for the laser beam 230. FIGS. 5A and 5B illustrate the physical profiles (i.e., shapes) of the laser beam 230 through a substrate 400 having a first thickness $T_1$ and a second thickness $T_2$, as projected by the telecentric lens 234 and a standard relay lens 500, respectively. As shown in FIG. 5A, the telecentric lens 234 minimizes beam divergence of the laser beam 230 in far field and increases the peak intensity thereof over larger distances, thus enabling consistent drilling of features 130 with uniform dimensions $LB_1$ through each thickness $T_1$ and $T_2$ of the substrate 400. This is particularly beneficial during drilling of large arrays of narrow vias 120 and/or through-vias 170 in samples having even the slightest variations in thickness, as well as during drilling processes in which features are patterned in different samples having different thicknesses, since no focus adjustments are needed between the different samples. In FIG. 5B, a limited depth of focus of the relay lens 500 causes beam convergence and divergence, resulting in the peak intensity of the laser beam 230 varying throughout a propagation path thereof. The variance in beam profile and intensity results in dimensional non-uniformity of the dimension $LB_2$ between the features 130 drilled into each thickness $T_1$ and $T_2$ of the substrate 400.

Figure 6:
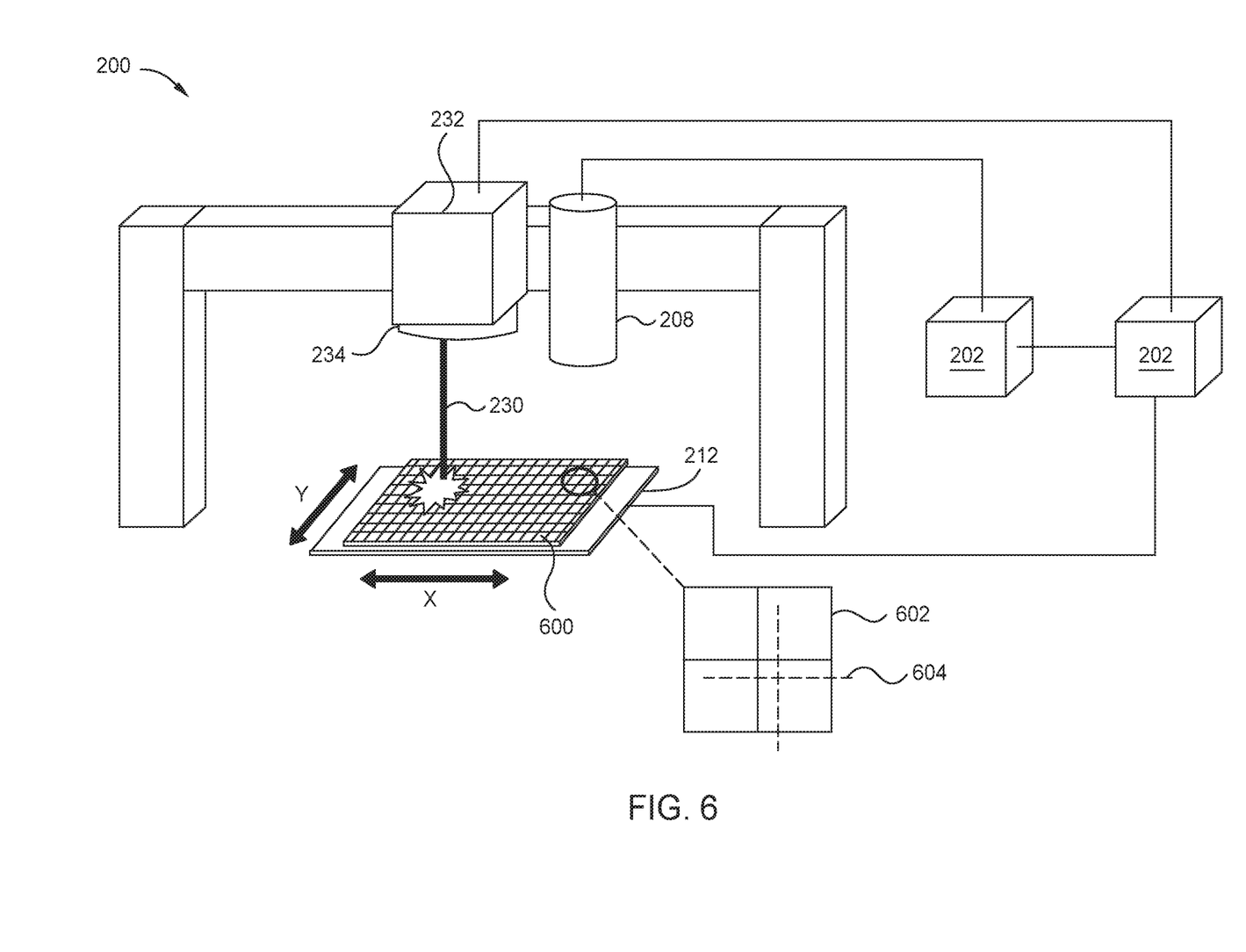
FIG. 6 schematically illustrates a schematic diagram of a calibration mechanism of the laser system of FIG. 2 according to embodiments of the present disclosure.

FIG. 6 illustrates a schematic diagram depicting a closed loop calibration mechanism utilized by the laser system 200 to calibrate and align the scanner 232 for laser drilling. As shown, the laser system 200 may load a calibration plate 600 onto the stage 212 and/or wafer nest 220 and laser pattern a top surface of the calibration plate 600 with grid-like or crosshair markings 602. The grid-like or crosshair markings 602 may have any suitable degree of fineness depending on the number and features 130 to be formed during laser patterning. Upon marking the calibration plate 600, the calibration plate 600 is mechanically translated to an absolution position via the stage 212, and the X and Y lateral position coordinates of the calibration plate 600 are measured by the controller 210 using the camera 208 and one or more linear stage encoders. The actual positions of the markings 602 are compared (e.g., evaluated) with nominal (e.g., desired) positions 604, and updated trajectories for the laser beam 230 by the scanner 232 are interpolated by the controller 210. Corrected instructions may be auto-coded and stored within the memory of the controller 210 for instructing the CPU in further calibration cycles and/or laser drilling processes. Upon auto-generation of the corrected instructions, the calibration mechanism may be repeated until the degree of measurement error exceeds the degree of potential correction improvement, after which laser drilling processes may be performed. In certain embodiments, the calibration mechanism described above enables alignment of actual features with nominal positions having a discrepancy of less than about 5 µm.

The systems and methods disclosed herein include laser ablation systems and methods for forming features, such as vias and cavities, in a semiconductor package device. The laser ablation systems described herein can produce tunable laser beams having a desired frequency, pulse width, pulse shape, and pulse energy based on desired sizes of patterned features and on the material in which the patterned features are formed. The adjustability of the laser beams provides rapid and accurate drilling of vast arrays of high density features in semiconductor package device structures with controlled depth and topography, thus enabling the formation of thin-form-factor packages with high chip or die-to-package volume ratios. Accordingly, the systems and methods described herein enable greater I/O scaling to meet the ever-increasing bandwidth and power efficiency demands of artificial intelligence (AI) and high performance computing (HPC).

While the foregoing is directed to embodiments of the present disclosure, other and further embodiments of the disclosure may be devised without departing from the basic scope thereof, and the scope thereof is determined by the claims that follow.

What is claimed is:

1. A system for laser patterning a semiconductor device substrate, comprising:
a diode-pumped solid-state laser source configured to generate a pulsed laser beam, the laser source comprising a slab gain medium, the laser source further characterized by:
a pulse energy between about 0.25 mJ and about 10 mJ;
a pulse width between about 1 ns and about 4000 ns; and
a pulse frequency between about 1 kHz and about 200 kHz;
a galvanometer optical scanner;
a first telecentric lens having a field of view (FOV) with lateral dimensions substantially equal to or greater than about 137 mm, the first telecentric lens having a working distance between about 30 mm and about 500 mm; and
a second telecentric lens having FOV with lateral dimensions substantially equal to or greater than about 137 mm and a working distance between about 30 mm and about 500 mm.

2. The system of claim 1, wherein the laser source is an infrared (IR) laser source.

3. The system of claim 1, wherein the first telecentric lens has a telecentric error value of less than about 5°.

4. The system of claim 1, wherein the first telecentric lens is specific to IR wavelengths and the second telecentric lens is specific to UV wavelengths.

5. The system of claim 4, wherein the maximum telecentricity error and nominal spot size of the first and the second telecentric lenses are substantially the same.

6. The system of claim 1, further comprising a controller in communication with the laser source and the galvanometer optical scanner, the controller configured to modulate the pulse energy, the pulse width, and the pulse frequency of the laser source.

7. The system of claim 6, wherein the controller is further configured to modulate a pulse shape of the laser source.

8. The system of claim 7, the pulse shape of the laser source is rectangular or chair shaped.

9. The system of claim 6, further comprising an adjustable stage disposed on linear and parallel tracks.

10. The system of claim 9, wherein the adjustable stage is configured to receive a substrate having lateral dimensions of about 156 mm or greater.

11. The system of claim 9, wherein the adjustable stage is coupled to a linear stage encoder to provide location information of the stage to the controller.

12. The system of claim 11, further comprising a camera pointed at the adjustable stage and in communication with the controller.

13. The system of claim 12, wherein the camera, the adjustable stage, and the controller form a closed loop calibration system for positional calibration of the galvanometer optical scanner.

14. The system of claim 1, further comprising a debris collector for creating a cross-flow of circulated gas in a processing region of the system.

15. A system for laser patterning a semiconductor device substrate, comprising:

a diode-pumped solid-state laser source configured to generate a pulsed laser beam, the laser source comprising a slab gain medium, the laser source further characterized by:
  a pulse energy between about 0.25 mJ and about 10 mJ;
  a pulse width between about 1 ns and about 4000 ns; and
  a pulse frequency between about 1 kHz and about 200 kHz;
a galvanometer optical scanner;
a first telecentric lens having a field of view (FOV) with lateral dimensions substantially equal to or greater than about 137 mm, the telecentric lens having a working distance between about 30 mm and about 500 mm;
a second telecentric lens having FOV with substantially equal lateral dimensions to the first telecentric lens; and
an adjustable stage having bi-directional movement, the movement of the stage synchronized with a movement of the galvanometer optical scanner.

16. The system of claim 15, wherein the first telecentric lens has a telecentric error value of less than about 5°.

17. The system of claim 15, wherein the first telecentric lens is specific to IR wavelengths and the second telecentric lens is specific to UV wavelengths.

18. A system for laser patterning a semiconductor device substrate, comprising:

a diode-pumped solid-state laser source configured to generate a pulsed laser beam, the laser source comprising an infrared (IR) slab gain medium, the laser source further characterized by:
  a pulse energy between about 0.25 mJ and about 10 mJ;
  a pulse width between about 1 ns and about 4000 ns; and
  a pulse frequency between about 1 kHz and about 200 kHz;
a galvanometer optical scanner;
a first telecentric lens having a field of view (FOV) with lateral dimensions substantially equal to or greater than about 137 mm, the telecentric lens having a working distance between about 30 mm and about 500 mm;
an adjustable stage having bi-directional movement, the stage configured to translate from a loading position to a processing position for laser patterning and an absolute position for calibration of the galvanometer optical scanner; and
a controller in communication with the laser source, the galvanometer optical scanner, and the adjustable stage, the controller configured to modulate the pulse energy, the pulse width, and the pulse frequency of the laser source.

* * * * *